(12) United States Patent
Hong et al.

(10) Patent No.: US 10,732,506 B2
(45) Date of Patent: Aug. 4, 2020

(54) METHOD OF FABRICATING INTEGRATED CIRCUIT DEVICES

(71) Applicant: Samsung Electronics Co., Ltd., Suwon-si (KR)

(72) Inventors: Suk-koo Hong, Suwon-si (KR); Jeong-ho Mun, Yongin-si (KR); Jin-joo Kim, Seoul (KR); Gum-hye Jeon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 206 days.

(21) Appl. No.: 15/968,851

(22) Filed: May 2, 2018

(65) Prior Publication Data

US 2019/0096662 A1   Mar. 28, 2019

(30) Foreign Application Priority Data

Sep. 26, 2017   (KR) .......................... 10-2017-0124529

(51) Int. Cl.
| | | |
|---|---|---|
| *G03F 7/20* | (2006.01) | |
| *G03F 7/09* | (2006.01) | |
| *G03F 7/38* | (2006.01) | |
| *H01L 21/027* | (2006.01) | |
| *G03F 7/039* | (2006.01) | |
| *G03F 7/022* | (2006.01) | |
| *H01L 21/266* | (2006.01) | |
| *G03F 7/095* | (2006.01) | |
| *G03F 7/32* | (2006.01) | |

(52) U.S. Cl.
CPC ............ *G03F 7/2002* (2013.01); *G03F 7/022* (2013.01); *G03F 7/039* (2013.01); *G03F 7/091* (2013.01); *G03F 7/095* (2013.01); *G03F 7/38* (2013.01); *H01L 21/0276* (2013.01); *H01L 21/266* (2013.01); *G03F 7/32* (2013.01)

(58) Field of Classification Search
CPC ........................................................ G03F 7/091
See application file for complete search history.

(56) References Cited

U.S. PATENT DOCUMENTS

| | | | |
|---|---|---|---|
| 5,554,481 A | 9/1996 | Kawabe et al. | |
| 5,792,586 A | 8/1998 | Hashimoto et al. | |
| 8,088,548 B2 | 1/2012 | Houlihan et al. | |
| 8,178,639 B2 | 5/2012 | Kim et al. | |
| 8,399,184 B2 | 3/2013 | Kim et al. | |
| 8,632,948 B2 | 1/2014 | Padmanaban et al. | |
| 8,741,542 B2 | 6/2014 | Tsuchimura et al. | |
| 8,871,423 B2 | 10/2014 | Yun et al. | |
| 2012/0177891 A1* | 7/2012 | Millward | H01L 21/0276 428/195.1 |
| 2012/0308939 A1* | 12/2012 | Kudo | G03F 7/091 430/326 |
| 2017/0153547 A1* | 6/2017 | Sim | C08F 220/18 |
| 2017/0283651 A1* | 10/2017 | Sim | C08L 33/08 |

FOREIGN PATENT DOCUMENTS

| | | |
|---|---|---|
| JP | 2011-501430 | 1/2011 |
| KR | 10-2007-0071630 | 4/2007 |
| KR | 10-2009-0078898 | 1/2008 |
| KR | 10-1111647 | 1/2012 |
| WO | WO 2010-104074 | 9/2012 |

* cited by examiner

*Primary Examiner* — Kathleen Duda
(74) *Attorney, Agent, or Firm* — Muir Patent Law, PLLC

(57) ABSTRACT

Provided is a method of fabricating an integrated circuit device, the method including: forming, on a substrate, a developable bottom anti-reflective coating (DBARC) layer including a chemically amplified polymer; forming, on the DBARC layer, a photoresist layer including a non-chemically amplified resin and a photoacid generator (PAG); generating an acid from the PAG in a first region selected from the photoresist layer, by exposing the first region; diffusing the acid in the exposed first region into a first DBARC region of the DBARC layer, the first DBARC region facing the first region; and removing the first region and the first DBARC region by developing the photoresist layer and the DBARC layer.

20 Claims, 6 Drawing Sheets

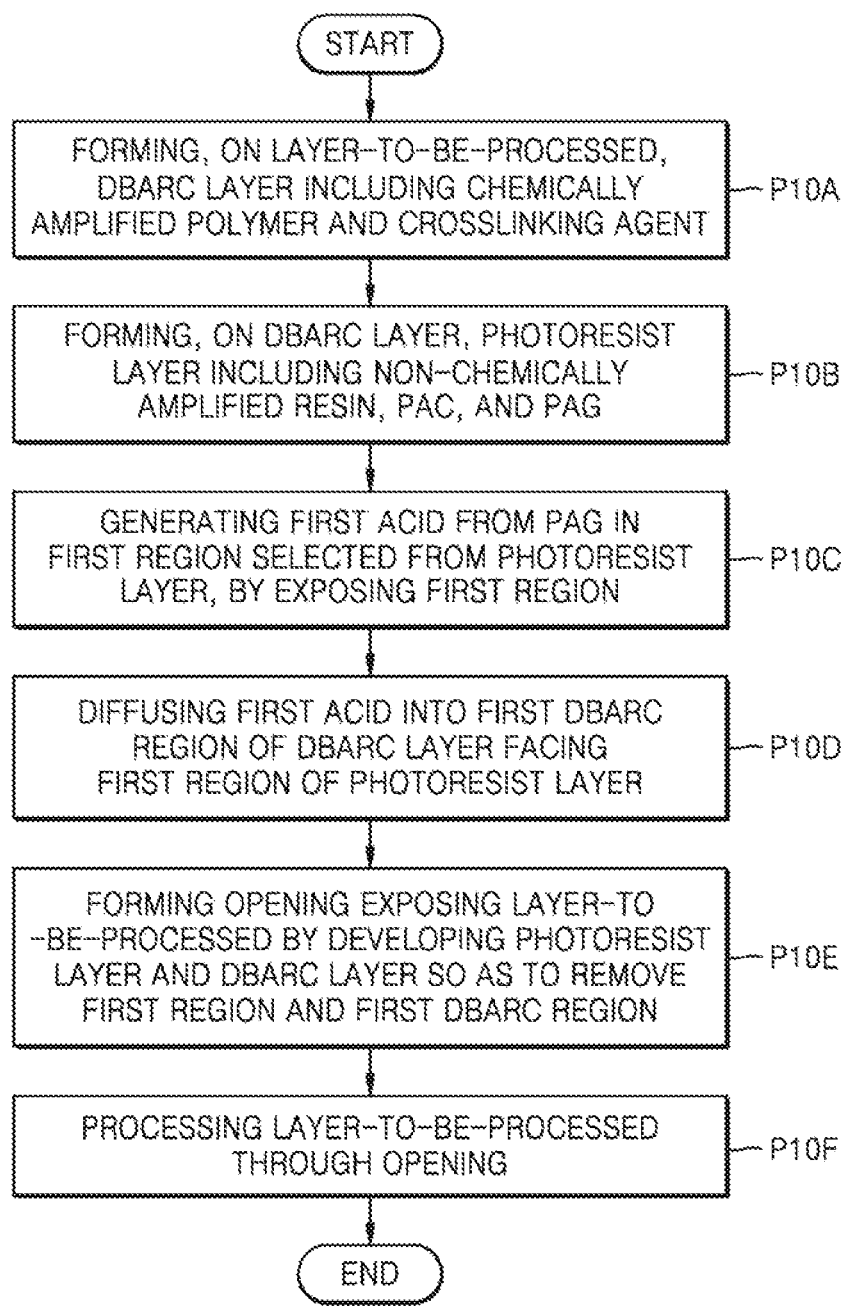

METHOD OF FABRICATING INTEGRATED CIRCUIT DEVICES

CROSS-REFERENCE TO RELATED APPLICATION

This application claims the benefit of priority under 35 U.S.C. § 119 to Korean Patent Application No. 10-2017-0124529, filed on Sep. 26, 2017, in the Korean Intellectual Property Office, the disclosure of which is incorporated herein in its entirety by reference.

BACKGROUND

The disclosure relates to a method of fabricating an integrated circuit device, and more particularly, to a method of fabricating an integrated circuit device, the method including an exposure process using i-line (365 nm) irradiation.

As downscaling and high integration of integrated circuit devices rapidly progresses, there is a need for techniques allowing improvement in dimensional precision of a pattern desired to be formed when the pattern is formed by using a large-area positive tone patterning process. In particular, to prevent residual defects caused by unwanted photoresist residues remaining in an exposed region in a large-area positive tone patterning process, there is a need to develop a process of forming a pattern by using an exposure process.

SUMMARY

The disclosure provides a method of fabricating an integrated circuit device, the method allowing improvement in dimensional precision of a region or pattern desired to be formed without residual defects caused by unwanted photoresist residues remaining in an exposed region in a large-area positive tone patterning process.

According to an aspect, there is provided a method of fabricating an integrated circuit device, the method including: forming, on a substrate, a developable bottom anti-reflective coating (DBARC) layer including a chemically amplified polymer; forming, on the DBARC layer, a photoresist layer including a non-chemically amplified resin, a photoactive compound (PAC), and a photoacid generator (PAG); generating a first acid from the PAG and a second acid derived from the PAC in a first region of the photoresist layer by exposing the first region of the photoresist layer to light; diffusing the first acid in the exposed first region of the photoresist layer into a first DBARC region of the DBARC layer, the first DBARC region facing the first region of the photoresist layer; and removing the first region and the first DBARC region by developing the photoresist layer and the DBARC layer.

According to another aspect, there is provided a method of fabricating an integrated circuit device, the method including: forming, on a layer-to-be-processed, a DBARC layer including a chemically amplified polymer and a crosslinking agent; forming, on the DBARC layer, a photoresist layer including a non-chemically amplified resin, a photoactive compound (PAC), and a PAG; generating a first acid derived from the PAG and a second acid derived from the PAC in a first region of the photoresist layer by exposing the first region of the photoresist layer to light; diffusing the first acid in the exposed first region of the photoresist layer into a first DBARC region of the DBARC layer; forming an opening that exposes the layer-to-be-processed by developing the photoresist layer and the DBARC layer so as to remove the first region and the first DBARC region; and processing the layer-to-be-processed through the opening.

According to yet another aspect, there is provided a method of fabricating an integrated circuit device, the method including: forming, on a substrate, a DBARC layer including a chemically amplified polymer and a crosslinking agent; forming, on the DBARC layer, a photoresist layer including an alkali-soluble novolac resin, a PAG, and a PAC, the PAG including at least one of a diazodisulfone compound and a sulfonate; generating sulfonic acid from the PAG in a first region of the photoresist layer by exposing the first region of the photoresist layer to light; diffusing the sulfonic acid in the first region into a first DBARC region of the DBARC layer; and removing the first region and the first DBARC region by developing the photoresist layer and the DBARC layer.

According to the method of fabricating an integrated circuit device in performing a large-area thick layer patterning process in which exposure and development processes are performed on a photoresist layer having a relatively high thickness over a relatively large area on a layer-to-be-processed, a photoresist layer including a non-chemically amplified resin and a PAG is formed on a DBARC layer including a chemically amplified polymer, and an acid generated from the PAG in an exposed region of the photoresist layer during the exposure of the photoresist layer is diffused into the DBARC layer, thereby deprotecting the chemically amplified polymer included in the DBARC layer. Thus, the photoresist layer and the DBARC layer may be simultaneously developed, and unneeded portions of the photoresist layer and the DBARC layer may be cleanly removed without causing residual defects during the development process. Therefore, a mask pattern having a vertical sidewall profile may be formed from a stacked structure of the DBARC layer and the photoresist layer, and when the layer-to-be-processed under the mask pattern is processed by using the mask pattern, critical dimensions of processing regions or patterns desired to be formed in the layer-to-be-processed may be precisely controlled, thereby improving dimensional precision.

BRIEF DESCRIPTION OF THE DRAWINGS

The disclosed embodiments will be more clearly understood from the following detailed description taken in conjunction with the accompanying drawings in which:

FIG. 1 is a flowchart illustrating a method of fabricating an integrated circuit device, according to exemplary embodiments;

DETAILED DESCRIPTION OF THE EMBODIMENTS

Figure 2A:
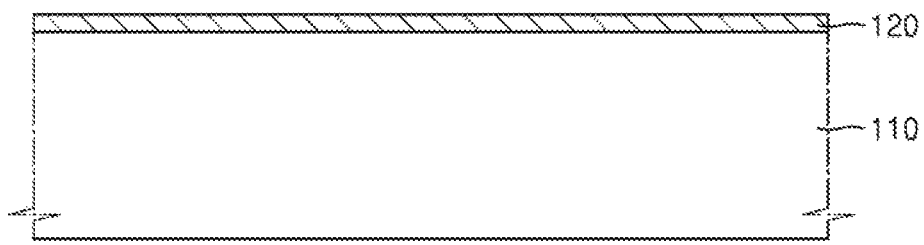
FIGS. 2A to 2G are cross-sectional views illustrating sequential processes of a method of fabricating an integrated circuit device, according to exemplary embodiments.

Hereinafter, embodiments will be described in detail with reference to the accompanying drawings. Like components will be denoted by like reference numerals throughout the specification, and repeated descriptions thereof will be omitted.

FIG. 1 is a flowchart illustrating a method of fabricating an integrated circuit device, according to exemplary embodiments. FIGS. 2A to 2G are cross-sectional views illustrating sequential processes of a method of fabricating an integrated circuit device, according to exemplary embodiments.

Referring to FIGS. 1 and 2A, in a process P10A, a developable bottom anti-reflective coating (DBARC) layer 120 is formed on a layer-to-be-processed 110. The DBARC layer 120 includes a chemically amplified polymer and a crosslinking agent.

In some embodiments, the layer-to-be-processed 110 may include a semiconductor substrate. For example, the layer-to-be-processed 110 may include a semiconductor such as Si or Ge, or a compound semiconductor such as SiGe, SiC, GaAs, InAs, or InP. In some other embodiments, the layer-to-be-processed 110 may be an insulating film or a conductive layer. For example, the layer-to-be-processed 110 may include a metal, an alloy, a metal carbide, a metal nitride, a metal oxynitride, a metal oxycarbide, a semiconductor, polysilicon, oxide, nitride, oxynitride, or combinations thereof.

The DBARC layer 120 may control diffuse reflection of light from a light source used during an exposure process for the fabrication of the integrated circuit device. In some embodiments, the DBARC layer 120 may absorb reflected light that is reflected from the layer-to-be-processed 110 located under the DBARC layer 120. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

In some embodiments, to form the DBARC layer 120, a DBARC composition may be spin-coated on the layer-to-be-processed 110. The DBARC layer 120 may not substantially include a photoacid generator (PAG) generating an acid by light.

The DBARC composition may include a chemically amplified polymer, a crosslinking agent, and a solvent. The chemically amplified polymer may be, for example, a type of photoresist that relies on the catalytic action of a photo-generated acid during the post-exposure processes to alter the solubility of the exposed film.

The chemically amplified polymer may include at least one repeating unit having an acid-labile group. In some embodiments, the at least one repeating unit having the acid-labile group, in the chemically amplified polymer, may include an acrylate derivative, without being limited thereto. The at least one repeating unit having the acid-labile group may be present in an amount of about 1 mol % to about 40 mol % in the chemically amplified polymer based on a total weight of the chemically amplified polymer.

The acid-labile group may be selected from the group consisting of tert-butoxycarbonyl (t-BOC), isonorbornyl, 2-methyl-2-adamantyl, 2-ethyl-2-adamantyl, 3-tetrahydrofuranyl, 3-oxocyclohexyl, γ-butyllactone-3-yl, mavalonic-lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-buthoxycarbonylmethyl, methoxymethyl, ethoxymethyl, trimethoxysilyl, and triethoxysilyl groups.

In some embodiments, the chemically amplified polymer included in the DBARC composition may further include a repeating unit having an acrylate derivative substituent that includes a hydroxyl group (—OH). In some other embodiments, the chemically amplified polymer included in the DBARC composition may further include a repeating unit including a light-absorbing functional group that includes an aromatic group. For example, the light-absorbing functional group may include a substituted or unsubstituted phenyl, naphthyl, anthracenyl, phenanthryl, acridinyl, quinolinyl, diazoquinolinyl group, or the like, without being limited thereto. The chemically amplified polymer includes the light-absorbing functional group, thereby absorbing light passing through the photoresist layer in a subsequent exposure process. Thus, light may be suppressed from being reflected toward the photoresist layer by the layer-to-be-processed 110.

In some embodiments, the chemically amplified polymer included in the DBARC composition may include a repeating unit represented by General Formula (I):

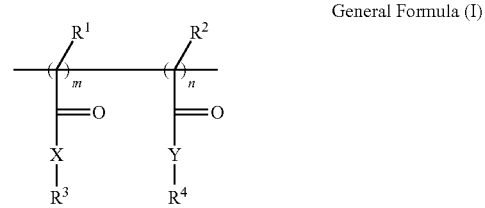

General Formula (I)

wherein $R^1$ and $R^2$ are each independently a hydrogen atom or a C1 to C4 alkyl group, —X— and —Y— are each independently a bivalent functional group selected from among alkylene, arylene, oxyalkylene, alkyleneoxy, oxyarylene, aryleneoxy, carbonyl, oxy, oxycarbonyl, carbonyloxy, carbonylalkylene, carbonylarylene, alkylenecarbonyl, arylenecarbonyl groups, and combinations thereof, $R^3$ is a C1 to C20 functional group including a hydroxyl group at an end thereof, $R^4$ is a light-absorbing functional group, and m+n=1, and 0.1≤m/(m+n)≤0.9.

For example, the chemically amplified polymer included in the DBARC composition may include a repeating unit represented by Chemical Formula (1):

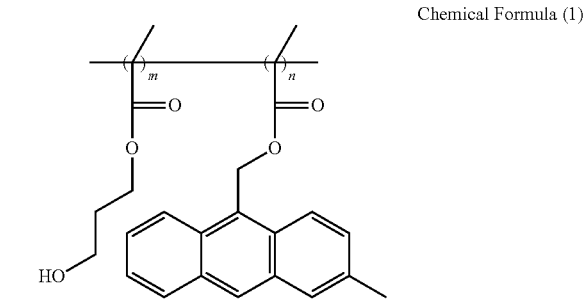

Chemical Formula (1)

wherein m+n=1, and 0.1≤m/(m+n)≤0.9.

The chemically amplified polymer may be present in an amount of about 1% by weight (wt %) to about 25 wt % in the DBARC composition. If the amount of the chemically amplified polymer is less than about 1 wt %, since the DBARC composition is not smoothly coated, the DBARC layer 120 may not be formed in a desired shape, and may also not sufficiently absorb light. In addition, if the amount of the chemically amplified polymer is greater than about 25 wt %, uniform coating of the DBARC composition may be difficult due to excessively high viscosity of the DBARC composition.

The crosslinking agent included in the DBARC composition may be bonded to a backbone of the chemically amplified polymer. The crosslinking agent may cure the chemically amplified polymer by inducing crosslinking of the chemically amplified polymer. In some embodiments, the crosslinking agent may include a C4 to C50 hydrocarbon compound. Examples of the crosslinking agent may include melamine-containing resins, methylols, glycoluril, polymeric glycolurils, benzoguanamine, urea, hydroxyalkylamide-containing resins, epoxy and epoxy-amine resins, blocked isocyanates, and divinyl monomers, without being limited thereto. In some other embodiments, the crosslinking agent may include an organic alcohol containing or not containing fluorine, or an epoxide substituent.

In some embodiments, the crosslinking agent may be a commercially available crosslinking agent. For example, the crosslinking agent may be MX-270, MW-30HM, or MX-280, each of which are commercially available from SAMHWA Chemicals Co., Ltd., without being limited thereto.

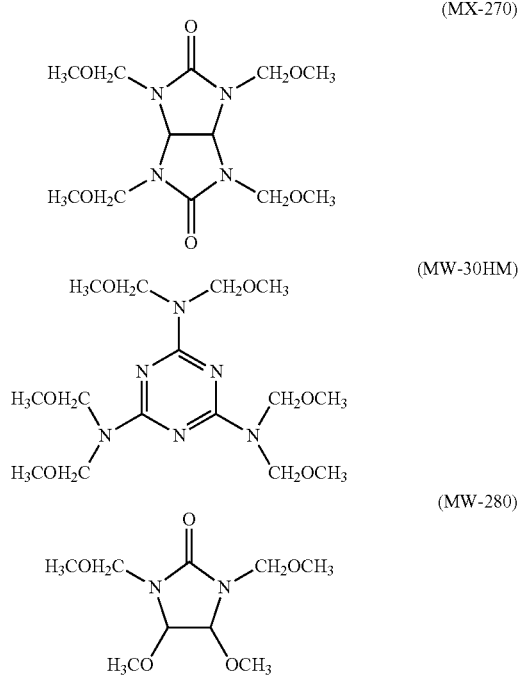

The crosslinking agent may be present in an amount of about 0.1 wt % to about 20 wt % in the DBARC composition. If the amount of the crosslinking agent is less than about 0.1 wt %, a sufficient degree of crosslinking required for forming the DBARC layer 120 may not be obtained, and if the amount of the crosslinking agent is greater than about 20 wt %, removal of the DBARC layer 120 may not be facilitated in a subsequent develop process due to excessive crosslinking of polymers.

The solvent included in the DBARC composition may include an organic solvent. In some embodiments, the solvent may include at least one of ethers, alcohols, glycol ethers, aromatic hydrocarbon compounds, ketones, and esters. For example, the solvent may be selected from among ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, propylene glycol monobutyl ether, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, and the like. These solvents may be used individually or in combinations of two or more. In some embodiments, an amount of the solvent in the DBARC composition may be adjusted so that a solid content in the DBARC composition ranges from about 3 wt % to about 20 wt %.

The DBARC composition may further include a thermal acid generator (TAG) generating an acid by heat. The TAG may include an aliphatic or alicyclic compound. For example, the TAG may include at least one compound selected from the group consisting of carbonate esters, sulfonate esters, and phosphate esters. More specifically, the TAG may include at least one compound selected from the group consisting of cyclohexyl nonafluorobutanesulfonate, norbornyl nonafluorobutanesulfonate, tricyclodecanyl nonafluorobutanesulfonate, adamantyl nonafluorobutanesulfonate, cyclohexyl nonafluorobutanecarbonate, norbornyl nonafluorobutanecarbonate, tricyclodecanyl nonafluorobutanecarbonate, adamantyl nonafluorobutanecarbonate, cyclohexyl nonafluorobutanephosphonate, norbornyl nonafluorobutanephosphonate, tricyclodecanyl nonafluorobutanephosphonate, and adamantyl nonafluorobutanephosphonate.

The DBARC composition may further include a surfactant. The surfactant may be a nonionic, cationic, anionic, or amphoteric surfactant. The surfactant may improve coating defects due to an increase in solid content and also improve coating uniformity when the DBARC composition is coated on the layer-to-be-processed 110. In some embodiments, the surfactant may include polyoxyethylene lauryl ether, polyoxyethylene stearyl ether, polyoxyethylene octylphenol ether, polyoxyethylene sorbitan monolaurate, Surfynol series commercially available from Air Products and Chemicals, Inc., F-series (e.g., F-410, F-444, F-477, R-08, R-30, or the like) commercially available from DIC Co., Ltd., or the like. The surfactant may be present in an amount of about 0.01 wt % to about 1 wt % in the DBARC composition. If the amount of the surfactant is greater than about 1 wt %, the DBARC layer 120 may have a poor quality.

The DBARC composition may further include a base. The base may include an aromatic amine, an aliphatic amine, or a cyclic aliphatic amine. In some embodiments, the base may include at least one of a primary amine, a secondary amine, and a tertiary amine. For example, the base may include triethanolamine, triethylamine, tributylamine, tripropylamine, hexamethyldisilazane, or combinations thereof, without being limited thereto.

To form the DBARC layer 120 on the layer-to-be-processed 110 according to the process P10A of FIG. 1, the DBARC composition may be coated on the layer-to-be-processed 110 and then thermally treated, thereby inducing crosslinking of polymers included in the DBARC composition. The process of thermally treating the DBARC composition may be performed at a temperature of about 150° C. to about 400° C. for about 10 seconds to about 100 seconds. The chemically amplified polymer may be cured by the crosslinking agent during the thermal treatment of the DBARC composition. In some embodiments, the DBARC layer 120 may have a thickness of about 20 nm to about 100 nm, without being limited thereto.

Figure 2B:
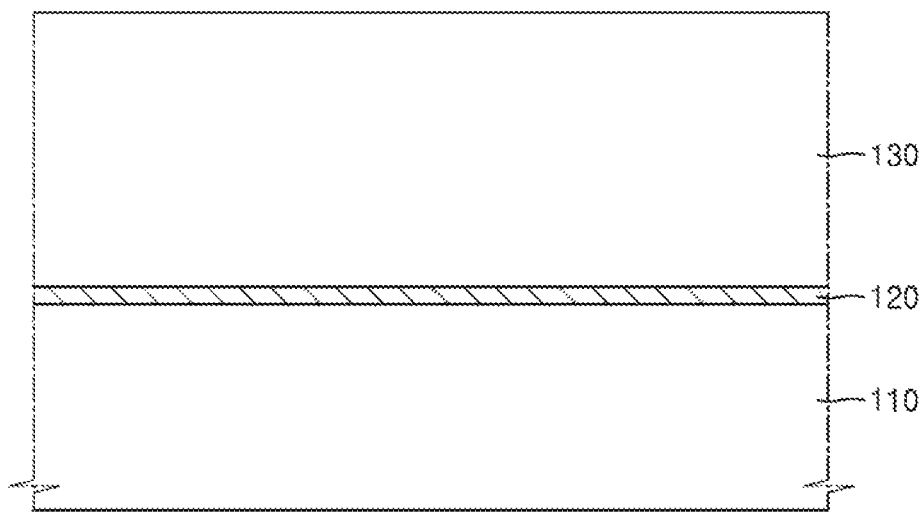

Referring to FIGS. 1 and 2B, in a process P10B of FIG. 1, a photoresist layer 130 is formed on the DBARC layer 120 formed in the process P10A. The photoresist layer 130 includes a non-chemically amplified resin, a photoactive compound (PAC), and a PAG.

The non-chemically amplified resin does not include an acid-labile group. Thus, even though an acid is generated from the PAG during a subsequent exposure process, a deprotection reaction of an acid-labile group from the non-chemically amplified resin included in the photoresist layer 130 may not be performed.

The non-chemically amplified resin may be an alkali-soluble novolac resin. To form the photoresist layer 130, a photoresist composition including the non-chemically amplified resin, the PAC, the PAG, and a solvent may be coated on the DBARC layer 120.

The alkali-soluble novolac resin may include a product obtained by an addition condensation reaction of at least one phenol compound and at least one aldehyde source in the presence of an acid catalyst. For example, the at least one phenol compound may be selected from among phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic acid esters, α-naphthol, β-naphthol, and the like, without being limited thereto. The at least one aldehyde source may include formaldehyde, furfural, benzaldehyde, nitrobenzaldehyde, acetaldehyde, or the like, without being limited thereto. The acid catalyst during the addition condensation reaction is not particularly limited, and may include, for example, hydrochloric acid, sulfuric acid, formic acid, acetic acid, oxalic acid, p-toluenesulfonic acid, or the like. The alkali-soluble novolac resin may have a weight-average molecular weight of about 1,000 to about 50,000, without being limited thereto.

The PAC included in the photoresist layer 130 may generate a weak acid having a pKa (acid dissociation constant) of about 1 to about 10, and may be changed into, for example, a carboxylic acid by light. The PAC may function as a dissolution inhibitor not dissolved in a developer before exposure. The PAC may be changed into a compound that is soluble in an alkali developer through a chemical reaction by exposure.

The PAC may include naphthoquinonediazide compounds. In some embodiments, the PAC may include a naphthoquinonediazide compound obtained by condensation of a polyhydroxy compound with at least one of 1,2-naphthoquinonediazide-4-sulfonyl chloride and 1,2-naphthoquinone diazide-5-sulfonyl chloride in the presence of a weak alkali such as, for example, triethylamine, sodium carbonate, or the like. The PAC may be present in an amount of about 15 wt % to about 20 wt % in the photoresist composition based on a total weight of the alkali-soluble novolac resin.

Examples of the polyhydroxy compound may include polyhydroxy benzophenone such as 2,3,4-trihydroxybenzophenone and 2,4,6-trihydroxybenzophenone; polyhydroxyphenyl alkyl ketones such as 2,3,4-trihydroxyacetophenone and 2,3,4-trihydroxyphenyl pentyl ketone; bis((poly)hydroxyphenyl) alkanes such as bis(2,4-dihydroxyphenyl) methane and bis(2,3,4-trihydroxyphenyl)methane; polyhydroxybenzoic acid esters such as propyl 3,4,5-trihydroxybenzoate and phenyl 2,3,4-trihydroxybenzoate; and the like, without being limited thereto.

The naphthoquinonediazide compounds set forth above may be used alone or in combination. The PAC may be present in an amount of about 10 wt % to about 50 wt % in the photoresist composition based on a total weight of the non-chemically amplified resin.

The PAG included in the photoresist layer 130 may be selected from among diazodisulfone compounds and onium salts.

In some embodiments, the PAG included in the photoresist layer 130 may include a diazodisulfone compound represented by General Formula (II):

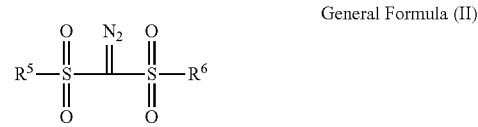

General Formula (II)

wherein each of $R^5$ and $R^6$ is a C1 to C16 linear or branched alkyl group, a C6 to C20 cycloalkyl group having monocyclic or polycyclic ring, or a C6 to C20 aryl group.

In some other embodiments, the PAG included in the photoresist layer 130 may include triarylsulfonium salts, diaryliodonium salts, sulfonates, or mixtures thereof. For example, the PAG may include triphenylsulfonium triflate, triphenylsulfonium antimonate, diphenyliodonium triflate, diphenyliodonium antimonate, methoxydiphenyliodonium triflate, di-t-butyldiphenyliodonium triflate, 2,6-dinitrobenzyl sulfonates, pyrogallol tris(alkylsulfonates), N-hydroxysuccinimide triflate, norbornene-dicarboximide-triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene-dicarboximide-nonaflate, triphenylsulfonium perfluorobutanesulfonate, triphenylsulfonium perfluorooctanesulfonate (PFOS), diphenyliodonium PFOS, methoxydiphenyliodonium PFOS, di-t-butyldiphenyliodonium triflate, N-hydroxysuccinimide PFOS, norbornene-dicarboximide PFOS, or mixtures thereof.

The PAG included in the photoresist layer 130 may generate a strong acid having a pKa (acid dissociation constant) of about −20 to about 1.

For example, the PAG may include at least one of compounds represented by the following Chemical Formulae (2) to (11):

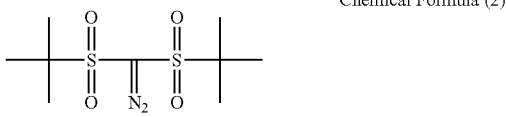

Chemical Formula (2)

-continued

Chemical Formula (3)
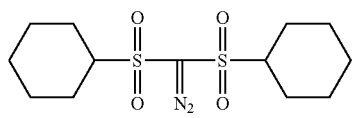

Chemical Formula (4)
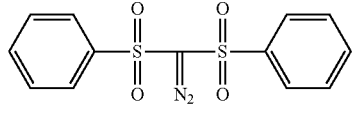

Chemical Formula (5)
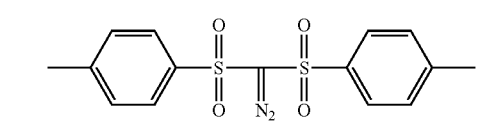

Chemical Formula (6)
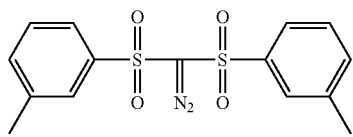

Chemical Formula (7)
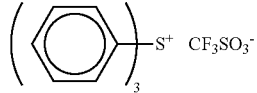

Chemical Formula (8)
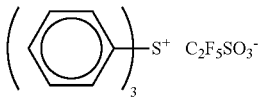

Chemical Formula (9)
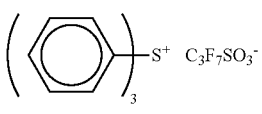

Chemical Formula (10)
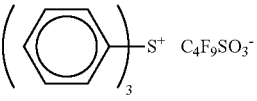

Chemical Formula (11)
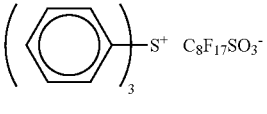

Among PAGs represented by Chemical Formulae (2) to (11), each of PAGs represented by Chemical Formulae (2) to (6) may generate an acid having a pKa of about −3 when exposed to light. Each of PAGs represented by Chemical Formulae (7) to (11) may generate an acid having a pKa of about −10 when exposed to light.

The PAGs may be used alone or in combination with one another in the photoresist composition. The PAG may be present in an amount of about 0.01 wt % to about 10 wt % in the photoresist composition based on the total weight of the non-chemically amplified resin.

The solvent included in the photoresist composition may include solvents substantially identical to the solvents which may be included in the DBARC composition and have been described with reference to the process P10A of FIG. 1 and to FIG. 2A.

The photoresist composition may further include at least one of an adhesion promoter and a surfactant.

The adhesion promoter is for improving adhesion between the photoresist layer 130 and the DBARC layer 120, and may include, for example, a silane coupling agent having a reactive functional group such as a carboxyl group, a methacryloyl group, a vinyl group, an isocyanate group, an epoxy group, or the like. For example, the adhesion promoter may include trimethoxysilylbenzoic acid, γ-methacryloyloxypropyltrimethoxysilane, vinyltriacetoxysilane, vinyltrimethoxysilane, γ-isocyanatepropyltriethoxysilane, γ-glycidoxypropyltrimethoxysilane, β-(3,4-epoxycyclohexyl)ethyltrimethoxysilane, or combinations thereof, without being limited thereto. The adhesion promoter may be present in an amount of about 0.001 wt % to about 10 wt % in the photoresist composition based on the total weight of the non-chemically amplified resin.

The surfactant, which may be included in the photoresist composition, may include surfactants substantially identical to the surfactants which may be included in the DBARC composition and have been described with reference to the process P10A of FIG. 1 and FIG. 2A. The surfactant may be present in an amount of about 0.001 wt % to about 10 wt % in the photoresist composition based on the total weight of the non-chemically amplified resin.

To form the photoresist layer 130 on the layer-to-be-processed 110 according to the process P10B of FIG. 1, the photoresist composition may be coated on the DBARC layer 120 and then thermally treated. The process of thermally treating the photoresist composition may be performed at a temperature of about 100° C. to about 150° C. for about 10 seconds to about 100 seconds. The photoresist layer 130 may have a thickness that is tens to hundreds of times the thickness of the DBARC layer 120. In some embodiments, the photoresist layer 130 may have a thickness of about 1 μm to about 6 μm, without being limited thereto.

Figure 2C:
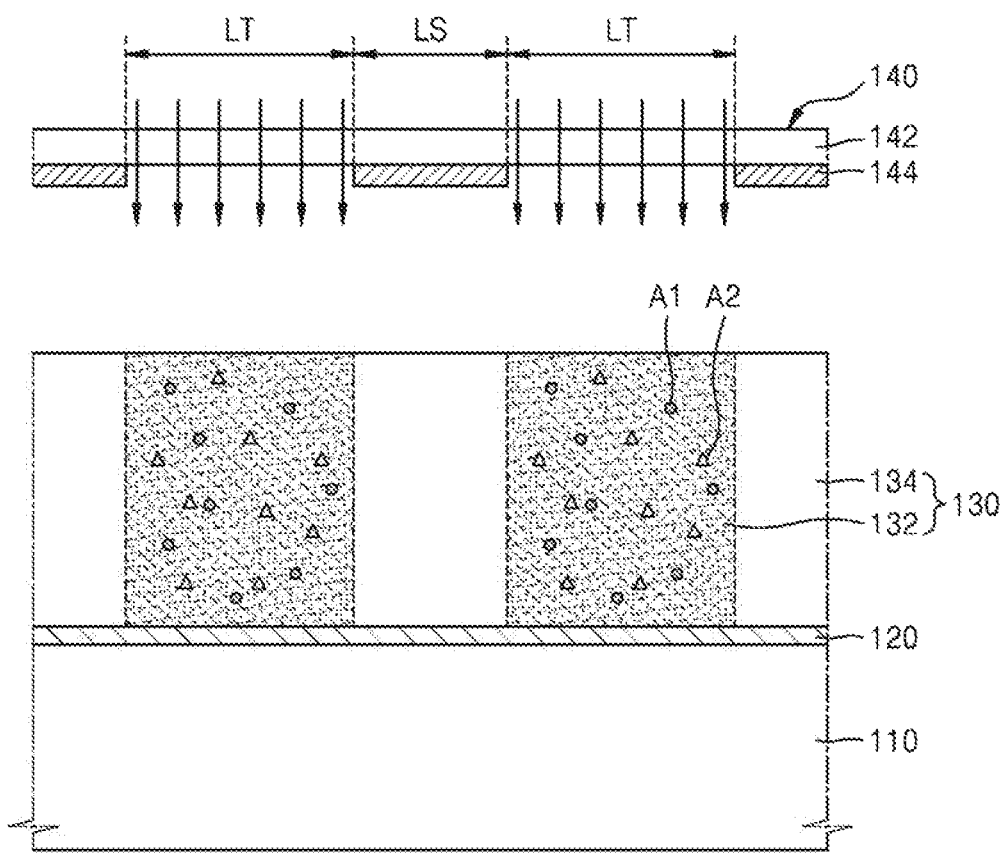

Referring to FIGS. 1 and 2C, in a process P10C, a first region 132 selected from the photoresist layer 130 is exposed, thereby generating a plurality of first acids A1 from the PAG in the first region 132. In some embodiments, when the PAG includes a diazodisulfone compound and/or a sulfonium salt, the plurality of first acids A1 may include sulfonic acid.

During the exposure of the first region 132, a plurality of second acids A2 may be generated from the PAC in the first region 132, the plurality of second acids A2 being weaker acids than the first acids A1. In some embodiments, each of the plurality of first acids A1 may have a pKa of about 1 to about 10, and each of the plurality of second acids A2 may have a pKa of about −20 to about 1.

Since light is not delivered to the PAG in a second region 134, which is a non-exposed region of the photoresist layer 130, an acid may not be generated from the PAG in the second region 134.

To expose the first region 132 of the photoresist layer 130, a photomask 140 having a plurality of light shielding areas LS and a plurality of light transmitting areas LT is aligned at a certain position over the layer-to-be-processed 110, and the first region 132 of the photoresist layer 130 may be exposed to light through the plurality of light transmitting areas LT of the photomask 140. To expose the first region 132 of the photoresist layer 130, an i-line (365 nm) light source may be used.

In the first region 132 of the photoresist layer 130, the plurality of first acids A1 may be generated from the PAG by light transmitting through the plurality of light transmitting areas LT during the exposure. Since the non-chemically amplified resin included in the photoresist layer 130 does not include an acid-labile group, a deprotection reaction of an acid-labile group by the plurality of first acids A1 generated from the PAG may not occur in the non-chemically amplified resin constituting the photoresist layer 130.

The photomask 140 may include a transparent substrate 142, and a plurality of light shielding patterns 144 formed in the plurality of light shielding areas LS on the transparent substrate 142. The photomask 140 may include quartz. Each of the plurality of light shielding patterns 144 may include chromium (Cr). The plurality of light transmitting areas LT may be defined by the plurality of light shielding patterns 144. For example, the plurality of light shielding patterns 144 may form boundaries around the plurality of light transmitting areas LT.

In some embodiments, the plurality of first acids A1 may be acids generated from at least one of the PAGs represented by Chemical Formulae (2) to (11). In some embodiments, the plurality of second acids A2 may be acids generated from a naphthoquinonediazide compound.

In some embodiments, the area of a top surface of the exposed first region 132 of the photoresist layer 130 may be equal to or greater than the area of a top surface of the non-exposed second region 134.

Figure 2D:
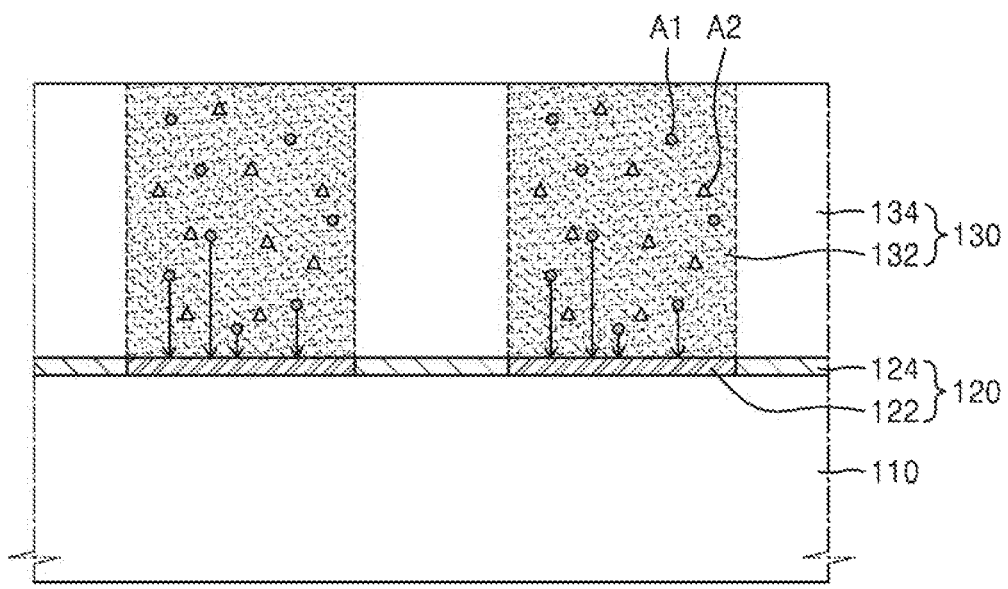

Referring to FIGS. 1 and 2D, in a process P10D, at least portions of the plurality of first acids A1 in the exposed first region 132 of the photoresist layer 130 are diffused into a first DBARC region 122 of the DBARC layer 120, which faces the first region 132 of the photoresist layer 130.

In some embodiments, to diffuse the first acids A1 from the first region 132 of the photoresist layer 130 into the first DBARC region 122, an annealing process may be used. For example, a result product obtained directly after the first region 132 of the photoresist layer 130 is exposed to light in the process P10C of FIG. 1 may be annealed at a temperature of about 50° C. to about 150° C., thereby diffusing the at least portions of the plurality of first acids A1 in the first region 132 into the first DBARC region 122 along a direction marked by arrows in FIG. 2D. The annealing process may be performed for about 10 seconds to about 100 seconds. In one example, the annealing process may be performed at a temperature of about 100° C. for about 60 seconds.

In some other embodiments, to diffuse the first acids A1 from the first region 132 of the photoresist layer 130 into the first DBARC region 122, without performing a separate annealing process, the first acids A1 may be diffused from the first region 132 of the photoresist layer 130 into the first DBARC region 122 by heat applied to the photoresist layer 130 during the exposure of the first region 132 of the photoresist layer 130 in the process P10C of FIG. 1.

As a result of diffusing the first acids A1 from the first region 132 of the photoresist layer 130 into the first DBARC region 122, deprotection of the acid-labile group from the chemically amplified polymer constituting the first DBARC region 122 and decrosslinking of crosslinked polymers occur in the first DBARC region 122 of the DBARC layer 120 due to the first acids A1, whereby the first DBARC region 122 may be changed to be easily dissolved in an alkali developer.

On the other hand, since the first acids A1 are not generated from the PAG in the second region 134 that is a non-exposed region of the photoresist layer 130, a second DBARC region 124 of the DBARC layer 120, which faces the second region 134 of the photoresist layer 130, may not include the first acids A1. Thus, a reaction of deprotection of the acid-labile group from the chemically amplified polymer may not occur in the second DBARC region 124.

Figure 2E:
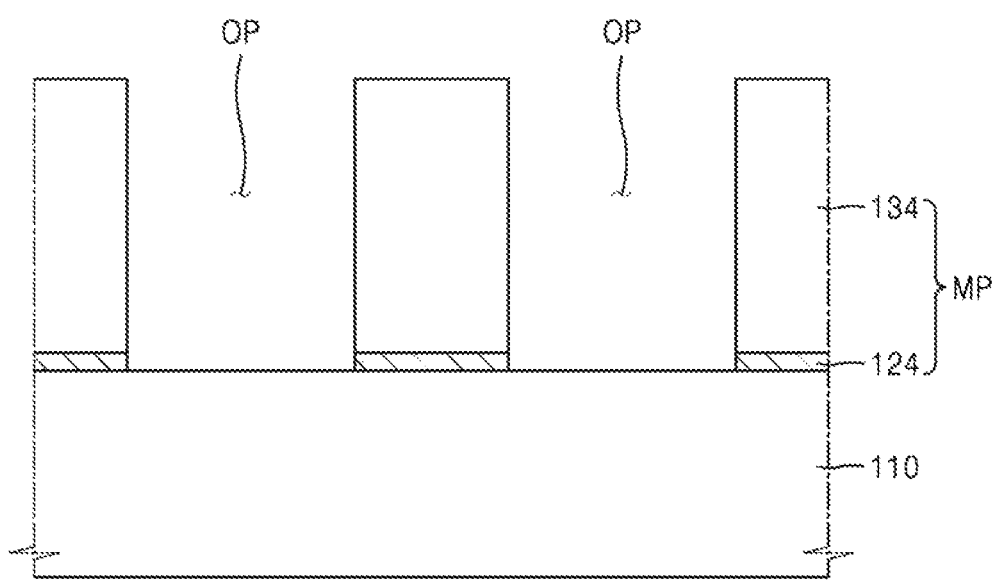

Referring to FIGS. 1 and 2E, in a process P10E, the photoresist layer 130 and the DBARC layer 120 are simultaneously developed, thereby removing the first region 132 of the photoresist layer 130 and the first DBARC region 122 of the DBARC layer 120. As a result, a mask pattern MP may be formed, the mask pattern MP including the second region 134, which is a non-exposed region of the photoresist layer 130, and the second DBARC region 124 facing the second region 134. The mask pattern MP may include a plurality of openings OP exposing the layer-to-be-processed 110.

To remove the first region 132 and the first DBARC region 122, the photoresist layer 130 and the DBARC layer 120 may be developed by using a developer, for example, a 2.38 wt % tetramethylammonium hydroxide (TMAH) solution.

Since the acid-labile group is deprotected from the chemically amplified polymer constituting the first DBARC region 122 due to the plurality of first acids A1 in the first DBARC region 122 of the DBARC layer 120, the first region 132 and the first DBARC region 122 may be cleanly removed in that the first DBARC region 122 partially remains on the layer-to-be-processed 110 during the development of the photoresist layer 130 and the DBARC layer 120 by using the developer. Therefore, after the photoresist layer 130 and the DBARC layer 120 are developed, residual defects such as a footing phenomenon and the like are not generated, and the obtained mask pattern MP may have a vertical sidewall profile. As such, the mask pattern MP, which includes the second region 134 that is a non-exposed region of the photoresist layer 130 and the second DBARC region 124 thereunder, has an improved profile, whereby a critical dimension of a desired processing region in the layer-to-be-processed 110 may be controlled with a high degree of precision when the layer-to-be-processed 110 is processed by using the mask pattern MP.

After the photoresist layer 130 and the DBARC layer 120 are developed, a cleaning process for removing contaminants such as developer residues, photoresist residues, and the like may be performed by using a cleaning solution.

In some embodiments, after the mask pattern MP is formed, a total area of exposed regions of the layer-to-be-processed 110 exposed by the plurality of openings OP may be at least 50% of a total area of the entire top surface of the layer-to-be-processed 110. For example, in the entire surface of the layer-to-be-processed 110, the total top surface area of regions exposed by the plurality of openings OP may be equal to or greater than a total top surface area of a region covered by the mask pattern MP.

Next, the layer-to-be-processed 110 exposed by the plurality of openings OP may be processed. For example, there may be performed various processes, such as a process of implanting impurity ions into the layer-to-be-processed 110 through the plurality of openings OP, a process of etching the layer-to-be-processed 110 through the plurality of openings OP, a process of forming an additional layer on the layer-to-be-processed 110 through the plurality of openings OP, a process of partially modifying the layer-to-be-processed 110 through the plurality of openings OP, or the like.

Figure 2F:
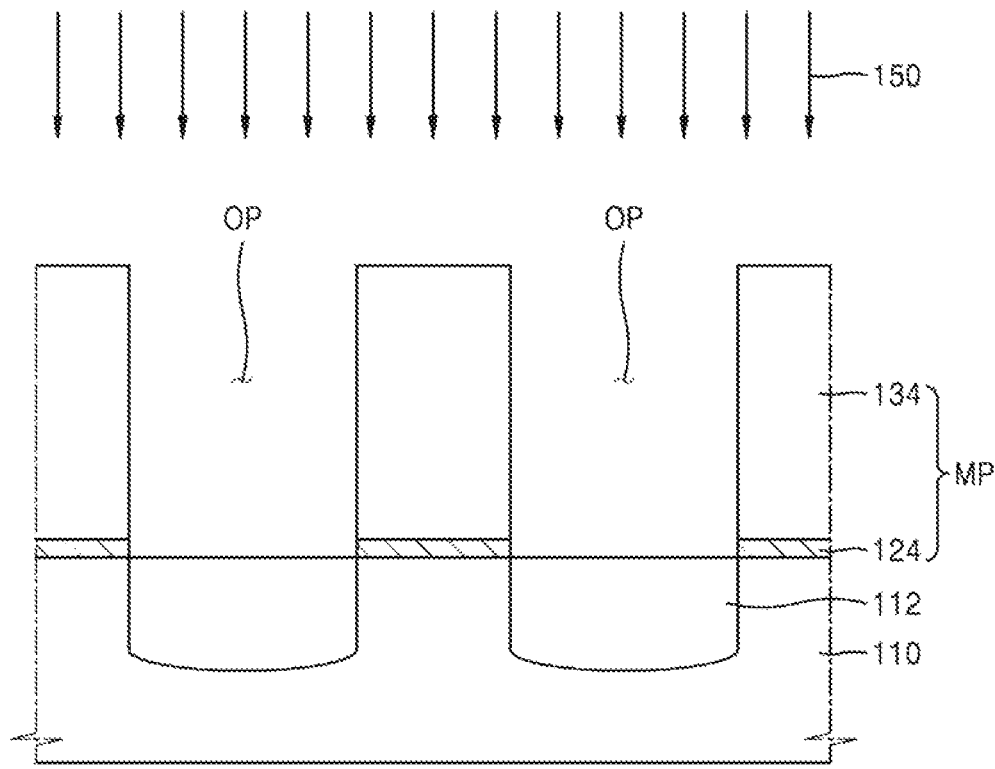

FIG. 2F illustrates an ion implantation process as an example of a process of processing the layer-to-be-processed 110 exposed by the plurality of openings OP. As shown in FIG. 2F, impurity ions 150 may be implanted into the layer-to-be-processed 110 through the plurality of openings OP, thereby forming a plurality of wells 112 in the layer-to-be-processed 110. Each of the plurality of wells 112 may include an impurity region into which the impurity ions 150 are implanted. The impurity ions 150 may be n-type dopants or p-type dopants. When the layer-to-be-processed 110 is a group IV semiconductor substrate, for example, an Si substrate, the n-type dopants may include group V elements such as phosphorus (P), arsenic (As), antimony (Sb), or the like, and the p-type dopants may include group III elements such as boron (B). However, the inventive concept is not limited to the examples set forth above, and the impurity ions 150 may variously vary depending upon a material constituting the layer-to-be-processed 110.

Figure 2G:
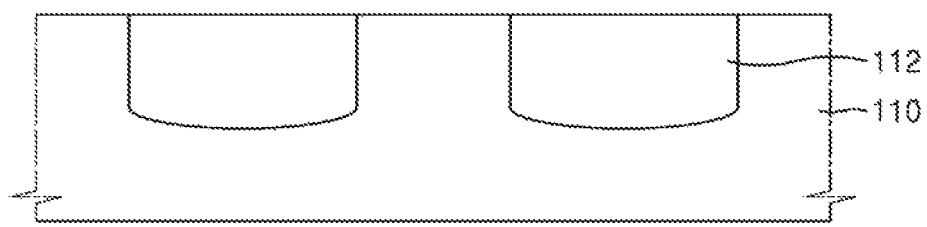

Referring to FIG. 2G, the mask pattern MP remaining on the layer-to-be-processed 110 may be removed. To remove the mask pattern MP, ashing and strip processes may be used.

According to the method of fabricating the integrated circuit device, which has been described with reference to FIGS. 1 and 2A to 2G, in performing a large-area thick layer patterning process in which exposure and development processes are performed on the photoresist layer 130 having a relatively high thickness over a relatively large area on the layer-to-be-processed 110, the DBARC layer 120 including the chemically amplified polymer is formed in advance before the photoresist layer 130 is formed, followed by forming the photoresist layer 130 including the non-chemically amplified resin and the PAG on the DBARC layer 120, and then, the acids generated from the PAG in the exposed region of the photoresist layer 130 during the exposure of the photoresist layer 130 are diffused into the DBARC layer 120, thereby deprotecting the chemically amplified polymer included in the DBARC layer 120. Thus, the photoresist layer 130 and the DBARC layer 120 may be developed simultaneously, and unneeded portions of the photoresist layer 130 and the DBARC layer 120 may be cleanly removed by the development process, without problems such as, for example, residual defects caused when portions to be removed from the photoresist layer 130 and the DBARC layer 120 remain on the layer-to-be-processed 110, and the like. Therefore, the mask pattern MP having a vertical sidewall profile may be formed from a stacked structure of the DBARC layer 120 and the photoresist layer 130, and when a subsequent process is performed on the layer-to-be-processed 110 by using the mask pattern MP, critical dimensions of processing regions or patterns desired to be formed in the layer-to-be-processed 110 may be precisely controlled, thereby improving dimensional precision.

Figure 3:
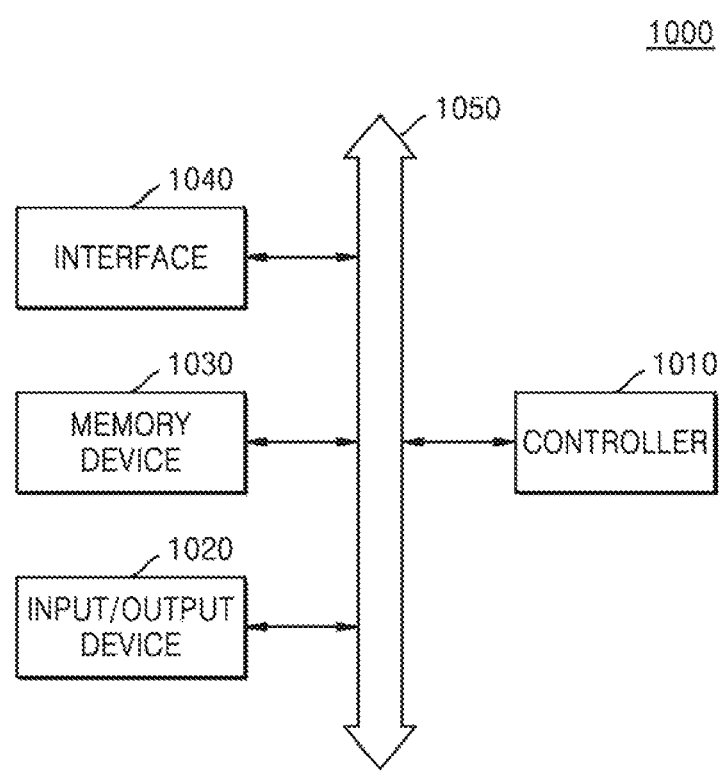
FIG. 3 illustrates a system including an integrated circuit device, according to exemplary embodiments.

FIG. 3 illustrates a system 1000 including the integrated circuit device, according to exemplary embodiments.

The system 1000 includes a controller 1010, an input/output device 1020, a memory device 1030, and an interface 1040. The system 1000 may be a mobile system or a system transmitting or receiving information. In some embodiments, the mobile system may be a PDA, a portable computer, a web tablet, a wireless phone, a mobile phone, a digital music player, or a memory card. The controller 1010 is for controlling programs executed on the system 1000, and may include a microprocessor, a digital signal processor, a microcontroller, or a device that is similar thereto. The input/output device 1020 may be used to input or output data of the system 1000. The system 1000 may be connected to devices external to the system 1000, for example, a personal computer or a network, by using the input/output device 1020, and may exchange data with the external devices. The input/output device 1020 may be, for example, a keypad, a keyboard, or a display.

The memory device 1030 may store codes and/or data for operations of the controller 1010, or may store data processed by the controller 1010. The memory device 1030 may include at least one integrated circuit device obtained by the method of fabricating an integrated circuit device, according to exemplary embodiments. For example, the memory device 1030 may include at least one integrated circuit device obtained by the method of fabricating an integrated circuit device, the method having been described with reference to FIGS. 1 to 2G.

The interface 1040 may be a data transmitting path between the system 1000 and other devices external to the system 1000 for transmitting data therebetween. The controller 1010, the input/output device 1020, the memory device 1030, and the interface 1040 may communicate with each other through a bus 1050. The system 1000 may be used for mobile phones, MP3 players, navigation systems, portable multimedia players (PMPs), solid state disks (SSDs), or household appliances.

While the inventive concept has been particularly shown and described with reference to embodiments thereof, it will be understood that various changes in form and details may be made therein without departing from the spirit and scope of the following claims.

What is claimed is:

1. A method of fabricating an integrated circuit device, the method comprising:
    forming, on a substrate, a developable bottom anti-reflective coating (DBARC) layer comprising a chemically amplified polymer;
    forming, on the DBARC layer, a photoresist layer comprising a non-chemically amplified resin, a photoactive compound (PAC), and a photoacid generator (PAG);
    generating a first acid from the PAG and a second acid derived from the PAC in a first region of the photoresist layer by exposing the first region of the photoresist layer to light;
    diffusing the first acid in the exposed first region of the photoresist layer into a first DBARC region of the DBARC layer, the first DBARC region facing the first region of the photoresist layer; and
    removing the first region and the first DBARC region by developing the photoresist layer and the DBARC layer simultaneously,
    wherein the first acid has a first acid dissociation constant (pKa) of about −20 to about 1, and the second acid has a second pKa of about 1 to about 10.

2. The method according to claim 1, wherein the forming of the DBARC layer comprises:
    coating, on the substrate, a DBARC composition comprising the chemically amplified polymer, a crosslinking agent, and a solvent; and
    thermally treating the coated DBARC composition.

3. The method according to claim 2, wherein the DBARC composition further comprises at least one of a thermal acid generator (TAG), a surfactant, and a base.

4. The method according to claim 1, wherein, in the forming of the DBARC layer, the chemically amplified polymer comprises a repeating unit comprising an acrylate derivative that includes an acid-labile group.

5. The method according to claim 1, wherein the forming of the DBARC layer comprises coating, on the substrate, a DBARC composition not comprising a PAG.

6. The method according to claim 1, wherein, in the forming of the photoresist layer, the non-chemically amplified resin does not comprise an acid-labile group.

7. The method according to claim 1, wherein the forming of the photoresist layer comprises:
    coating, on the substrate, a photoresist composition comprising an alkali-soluble novolac resin, a PAC, and the PAG; and
    thermally treating the coated photoresist composition.

8. The method according to claim 7,
wherein the PAC comprises a naphthoquinonediazide compound, and
wherein the PAG comprises a diazodisulfone compound or an onium salt.

9. The method according to claim 1, wherein the generating of the first acid from the PAG comprises exposing the first region by using an i-line (365 nm) light source.

10. The method according to claim 1, wherein the DBARC layer does not comprise a material generating an acid by light.

11. A method of fabricating an integrated circuit device, the method comprising:
forming, on a layer-to-be-processed, a developable bottom anti-reflective coating (DBARC) layer comprising a chemically amplified polymer and a crosslinking agent;
forming, on the DBARC layer, a photoresist layer comprising a non-chemically amplified resin, a photoactive compound (PAC), and a photoacid generator (PAG);
generating a first acid derived from the PAG and a second acid derived from the PAC in a first region of the photoresist layer by exposing the first region of the photoresist layer to light;
diffusing the first acid in the exposed first region of the photoresist layer into a first DBARC region of the DBARC layer;
forming an opening that exposes the layer-to-be-processed by developing the photoresist layer and the DBARC layer simultaneously so as to remove the first region and the first DBARC region; and
processing the layer-to-be-processed through the opening,
wherein the first acid has a first acid dissociation constant (pKa) of about −20 to about 1, and the second acid has a second pKa of about 1 to about 10.

12. The method according to claim 11,
wherein the chemically amplified polymer of the DBARC layer comprises a repeating unit comprising an acrylate derivative that contains an acid-labile group, and
wherein the non-chemically amplified resin of the photoresist layer does not comprise an acid-labile group.

13. The method according to claim 11, wherein, in the forming of the photoresist layer, the non-chemically amplified resin comprises an alkali-soluble novolac resin, the PAC comprises a naphthoquinonediazide compound, and the PAG comprises a diazodisulfone compound or an onium salt.

14. The method according to claim 11, wherein, in the forming of the photoresist layer, the PAG comprises a diazodisulfone compound represented by the following formula:

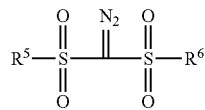

wherein each of $R^5$ and $R^6$ is a C1 to C16 linear or branched alkyl group, a C6 to C20 cycloalkyl group having monocyclic or polycyclic ring, or a C6 to C20 aryl group.

15. The method according to claim 11, wherein, in the exposing of the first region, the first acid comprises sulfonic acid.

16. The method according to claim 11, wherein, in the forming of the opening, a total surface area of an exposed top surface of the layer-to-be-processed exposed by the opening is at least 50% of a total surface area of the entire top surface of the layer-to-be-processed.

17. The method according to claim 11, wherein the processing of the layer-to-be-processed comprises implanting impurity ions into the layer-to-be-processed through the opening.

18. A method of fabricating an integrated circuit device, the method comprising:
forming, on a substrate, a developable bottom anti-reflective coating (DBARC) layer comprising a chemically amplified polymer and a crosslinking agent;
forming, on the DBARC layer, a photoresist layer comprising an alkali-soluble novolac resin, a photoacid generator (PAG), and a photoactive compound (PAC), the PAG comprising at least one of a diazodisulfone compound and a sulfonate;
generating sulfonic acid from the PAG and an acid from the PAC in a first region of the photoresist layer by exposing the first region of the photoresist layer to light;
diffusing the sulfonic acid in the first region into a first DBARC region of the DBARC layer; and
removing the first region and the first DBARC region by developing the photoresist layer and the DBARC layer,
wherein the acid from the PAC has a pKa of about 1 to about 10.

19. The method according to claim 18, wherein the forming of the DBARC layer comprises:
coating a DBARC composition on the substrate, wherein the DBARC composition comprises a polymer, the crosslinking agent, and a solvent and does not comprise a PAG, and the polymer comprises a repeating unit that comprises an acrylate derivative containing an acid-labile group; and
thermally treating the coated DBARC composition.

20. The method according to claim 18, wherein the diazodisulfone compound is represented by the following formula:

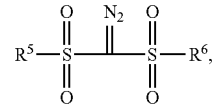

wherein each of $R^5$ and $R^6$ is a C1 to C16 linear or branched alkyl group, a C6 to C20 cycloalkyl group having monocyclic or polycyclic ring, or a C6 to C20 aryl group.

* * * * *